United States Patent
Lee

(10) Patent No.: US 8,564,022 B2
(45) Date of Patent: Oct. 22, 2013

(54) POWER DEVICE AND METHOD FOR MANUFACTURING THE SAME

(75) Inventor: Jae Hoon Lee, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 30 days.

(21) Appl. No.: 13/353,990

(22) Filed: Jan. 19, 2012

(65) Prior Publication Data

US 2013/0009164 A1    Jan. 10, 2013

(30) Foreign Application Priority Data

Jul. 4, 2011    (KR) .......................... 10-2011-0066016

(51) Int. Cl.
*H01L 29/06*    (2006.01)
*H01L 29/66*    (2006.01)

(52) U.S. Cl.
USPC ............... 257/194; 257/20; 257/24; 257/183; 257/192; 257/197; 257/E29.148; 257/E29.252

(58) Field of Classification Search
USPC ..................... 257/20, 24, 183, 192, 194, 197, 257/E29.148, E29.252
See application file for complete search history.

(56) References Cited

U.S. PATENT DOCUMENTS

| | | | |
|---|---|---|---|
| 7,400,001 B2 * | 7/2008 | Lee et al. | 257/194 |
| 8,030,638 B2 * | 10/2011 | Kikkawa | 257/11 |
| 2008/0258243 A1 * | 10/2008 | Kuroda et al. | 257/410 |
| 2008/0303064 A1 | 12/2008 | Sato | |
| 2011/0133249 A1 * | 6/2011 | Sato | 257/192 |

FOREIGN PATENT DOCUMENTS

| KR | 10-2008-0015951 A | 2/2008 |
|---|---|---|
| KR | 10-2010-0034921 A | 4/2010 |

* cited by examiner

*Primary Examiner* — Long K Tran
(74) *Attorney, Agent, or Firm* — McDermott Will & Emery LLP

(57) ABSTRACT

Provided is a power device. The power device may include a two-dimensional electron gas (2-DEG) layer in a portion corresponding to a gate electrode pattern since a second nitride layer is further formed on a lower portion of the gate electrode pattern after a first nitride layer is formed and thus, may be capable of performing a normally-OFF operation. Accordingly, the power device may adjust generation of the 2-DEG layer based on a voltage of a gate, and may reduce power consumption. The power device may regrow only the portion corresponding to the gate electrode pattern or may etch a portion excluding the portion corresponding to the gate electrode pattern and thus, a recess process may be omissible, a reproducibility of the power device may be secured, and a manufacturing process may be simplified.

6 Claims, 6 Drawing Sheets

POWER DEVICE AND METHOD FOR MANUFACTURING THE SAME

CROSS-REFERENCE TO RELATED APPLICATION

This application claims the benefit of Korean Patent Application No. 10-2011-0066016, filed on Jul. 4, 2011, in the Korean Intellectual Property Office, the disclosure of which is incorporated herein by reference.

BACKGROUND

1. Field of the Invention

The present invention relates to a power device and a manufacturing method thereof, and more particularly, to a power device that is capable of performing a normally-OFF operation.

2. Description of the Related Art

A semiconductor light emitting device (LED) is a semiconductor device that generates various colored lights based on the re-bonding of an electron and a hole at a P—N junction when a current is applied. Demand for the semiconductor LED has been continuously increased since the semiconductor LED has many advantages, such as, a long lifespan, a low power consumption, a fast start-up, a high vibration resistance, and the like, when compared to a filament-based LED. Particularly, a nitride semiconductor that emits a blue light, in a short wavelength range, has drawn attention.

As information communication technologies have been considerably developed globally, communication technologies for high-speed and large-capacity signal communication have been rapidly developed. Particularly, as demand for a personal cellular phone, a satellite communication, a military radar, a broadcasting communication, a communication relay, and the like in wireless communication technology has increased, the demands for a high-speed, a high-power electronic device required for a high-speed information communication system of a microwave band and a millimeter-wave band have increased. Also, research on a power device used for a high-power have been actively conducted to reduce energy loss.

Particularly, since the nitride semiconductor has advantageous properties, such as a high energy gap, a high heat stability, a high chemical stability, a high electronic saturation velocity of about $3 \times 10^7$ centimeters per second (cm/sec), the nitride semiconductor may be readily utilized as an optical element, and a high frequency and high power electronic device. Accordingly, research on the nitride semiconductor is being actively conducted the world over. An electronic device based on the nitride semiconductor may have varied advantages, such as, a high breakdown field of about $3 \times 10^6$ volts per centimeter (V/cm), a maximum current density, a stable high temperature operation, a high heat conductivity, and the like.

A heterostructure field effect transistor (HFET) generated based on a heterojunction of compound semiconductors has a high band-discontinuity at a junction interface, a high-electron density may be freed in the interface and thus, an electron mobility may increase. However, in an aluminum gallium nitride (AlGaN)/gallium nitride (GaN) HFET structure having a high electron mobility, a current flows even in a state where a signal is not applied and thus, power is consumed.

Since a power device may require a high current density, a power loss in a normally-ON device may be a great drawback. Accordingly, a normally-OFF device that embodies a metal-oxide semiconductor (MOS)HFET by removing an AlGaN layer from a gate portion has been developed. The normally-OFF device may form a recess structure by removing the AlGaN layer from the gate portion using an inductively coupled plasma-reactive ion etch (ICP-RIE) scheme, may embody the MOS HFET using an insulating material as a gate oxide, and may form a channel by applying a voltage. However, the normally-OFF device may have difficulty in accurately controlling a thickness of the AlGaN layer, and may have a drawback of deterioration in electrical properties when a surface is exposed to plasma while using the ICP-RIE scheme.

SUMMARY

According to an aspect of the present invention, there is provided a power device, including a substrate, a semi-insulating gallium nitride (GaN) layer formed on the substrate, an aluminum (Al)-doped GaN layer formed on the semi-insulating GaN layer, a first nitride layer formed on the Al-doped GaN layer, a second nitride layer formed on the first nitride layer, a source electrode pattern and a drain electrode pattern formed on the first nitride layer, and a gate electrode pattern formed on the second nitride layer.

The first nitride layer may include a material of Empirical Formula 1:

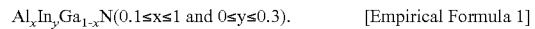
$Al_x In_y Ga_{1-x} N (0.1 \leq x \leq 1$ and $0 \leq y \leq 0.3)$.  [Empirical Formula 1]

The second nitride layer may include the same material as the first layer nitride layer.

The second nitride layer may include a material corresponding to the material of the first nitride layer doped with a p-type material.

When x is in a range of about $0.1 \leq x \leq 0.5$, and y is 0 in Empirical Formula 1, a thickness of the second nitride layer may be in a range from about 20 nanometers (nm) to 70 nm.

When x is 1 and y is 0 in Empirical Formula 1, a thickness of the second nitride layer may be in a range from about 2 nm to 7 nm.

The power device may further include an insulation pattern formed between the second nitride layer and the source electrode pattern, and an insulation pattern formed between the second nitride layer and the drain electrode pattern.

The insulation pattern may be selected from silicon oxide ($SiO_x$), silicon nitride ($SiN_x$), and aluminum oxide ($Al_2O_3$).

According to another aspect of the present invention, there is provided a power device manufacturing method, the method including forming a semi-insulating GaN layer on a substrate, forming an Al-doped GaN layer on the semi-insulating GaN layer, forming a first nitride layer on the Al-doped GaN layer, forming a second nitride layer on the first nitride layer, forming a source electrode pattern and a drain electrode pattern on the first nitride layer, and forming a gate electrode pattern on the second nitride layer.

The second nitride layer may be formed by regrowing nitride, on a lower portion of the gate electrode pattern, after the first nitride layer is formed.

The second nitride layer may be formed by etching a portion excluding a lower portion of the gate electrode pattern, after the first nitride layer is formed.

The first nitride layer may include a material of Empirical Formula 1:

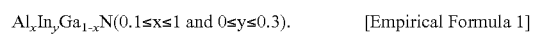
$Al_x In_y Ga_{1-x} N (0.1 \leq x \leq 1$ and $0 \leq y \leq 0.3)$.  [Empirical Formula 1]

The second nitride layer may include the same material as the first nitride layer.

The second nitride layer may include a material corresponding to the material of the first nitride layer doped with a p-type material.

When x is in a range of about 0.1≤x≤0.5, and y is 0 in Empirical Formula 1, a thickness of the second nitride layer may be in a range from about 20 nm to 70 nm.

When x is 1 and y is 0 in Empirical Formula 1, a thickness of the second nitride layer may be in a range from about 2 nm to 7 nm.

Additional aspects, features, and/or advantages of the invention will be set forth in part in the description which follows and, in part, will be apparent from the description, or may be learned by practice of the invention.

BRIEF DESCRIPTION OF THE DRAWINGS

These and/or other aspects, features, and advantages of the invention will become apparent and more readily appreciated from the following description of embodiments, taken in conjunction with the accompanying drawings of which.

DETAILED DESCRIPTION

Figure 1:
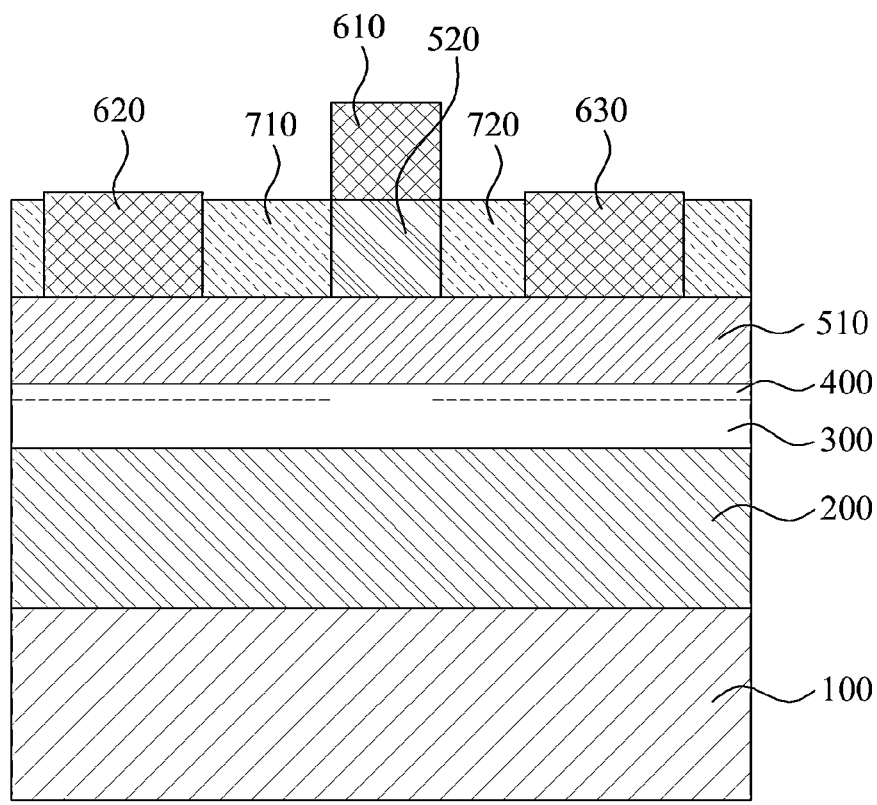
FIG. 1 is a cross-sectional view of a power device according to an embodiment of the present invention.

Reference will now be made in detail to embodiments of the present invention, examples of which are illustrated in the accompanying drawings, wherein like reference numerals refer to the like elements throughout. Embodiments are described below to explain the present invention by referring to the figures.

Throughout the specifications, when it is described that each of a layer, a side, a chip, and the like is formed "on" or "under" a layer, a side, a chip, and the like, the term "on" may include "directly on" and "indirectly on," and the term "under" may include "directly under" and "indirectly under." A standard for "on" or "under" of each element may be determined based on a corresponding drawing.

A size of each element in drawings may be exaggerated for ease of descriptions, and does not indicate a real size.

FIG. 1 illustrates a cross-section of a power device according to an embodiment of the present invention.

Referring to FIG. 1, the power device includes a substrate 100, a semi-insulating gallium nitride (GaN) layer 200, an aluminum (Al)-doped GaN layer 300, a two-dimensional electron gas (2-DEG) layer 400, a first nitride layer 510, a second nitride layer 520, a source electrode pattern 620, a drain electrode pattern 630, a gate electrode pattern 610, and insulation patterns 710 and 720.

In this example, a buffer (not illustrated) or the semi-insulating GaN layer 200 may be formed on the substrate 100. The substrate 100 may be an insulating substrate, for example, a glass substrate and a sapphire substrate, and may be a conductive substrate, for example, silicon (Si), silicon carbide (SiC), and zinc oxide (ZnO). Also, the substrate 100 may be a substrate for growing nitride, for example, an AlN-based substrate and a GaN-based substrate.

The semi-insulating GaN layer 200 may be formed on the substrate 100. The semi-insulating GaN layer 200 may prevent a leakage current towards the substrate, and may have a relatively high resistance to separate devices. The semi-insulating GaN layer 200 may have a significantly high resistance and thus, may have a semi-insulating property.

The Al-doped GaN layer 300 may be formed on the semi-insulating GaN layer 200. The Al-doped GaN layer 300 may perform a role of a channel layer. The 2-DEG layer 400 may be generated by a heterojunction between the Al-doped GaN layer 300 and the first nitride layer 510, which have different band gaps. When a voltage is applied to the gate electrode pattern 610, a channel may be formed on the 2-DEG layer 400, so that a current may flow between the source electrode pattern 620 and the drain electrode pattern 630.

The first nitride layer 510 may be formed on the Al-doped GaN layer 300, and the second nitride layer 520 may be formed on the first nitride layer 510.

The first nitride layer 510 may include a material of Empirical Formula 1.

$$Al_xIn_yGa_{1-x}N (0.1 \leq x \leq 1 \text{ and } 0 \leq y \leq 0.3)$$ [Empirical Formula 1]

The second nitride layer 520 may include the same material as the first nitride layer 510. The second nitride layer 520 may include a material corresponding to the material of the first nitride layer 520 doped with a p-type material. For example, the second nitride layer 520 may be $Al_xIn_yGa_{1-x}N$ (0.1≤x≤1 and 0≤y≤0.3), or p-$Al_xIn_yGa_{1-x}N$ (0.1≤x≤1 and 0≤y≤0.3). In this example, p-$Al_xIn_yGa_{1-x}N$ indicates that $Al_xIn_yGa_{1-x}N$ is doped with a p-type material, and the p-type material is a group III element. Since the second nitride layer 520 includes p-$Al_xIn_yGa_{1-x}N$, a charge is (+) and a channel is (−) and thus, charge neutrality is achieved. In a portion corresponding to a lower portion of the gate electrode pattern 610, the 2-DEG layer 400 is not formed and thus, a channel may be removed.

Here, a surface morphology and a piezoelectric effect of the first nitride layer 510 and the second nitride layer 520 may vary based on an Al content. Generally, the surface morphology and the piezoelectric-effect associated with the Al content are in a trade-off relationship. For example, when a surface morphology increases based on an Al content, a piezoelectric-effect may decrease, and when a piezoelectric-effect increases based on an Al content, a surface morphology may decrease.

In Empirical Formula 1, when x is 0 or 1, that is, when Empirical Formula 1 is GaN or AlN, a surface morphology of GaN or AlN may be high. However, when x is in a range between 0.1 and 1, the surface morphology may variously differ.

In the power device according to an aspect of the present invention, based on a surface morphology, x may be in a range of 0.1≤x≤0.5 in the first nitride layer 510 and a thickness of the first nitride layer 510 may be in a range from about 25 nanometers (nm) to 30 nm. When x is 0.3 in the first nitride layer 510, and the thickness of the first nitride layer 510 is in a range from about 25 nm to 30 nm, piezoelectric effect may be maximized.

To acquire an excellent surface morphology and to remove a piezoelectric effect, the second nitride layer 520 may be formed on a portion corresponding to the gate electrode pattern 610. That is, a range of x may be adjusted to 0.1≤x≤0.5 in the first nitride layer 510 so as to acquire the excellent surface morphology and a thickness of the second nitride layer 520 may be adjusted so as to prevent the 2-DEG layer 400 from being formed on the portion corresponding to the gate electrode pattern 610.

According to an aspect of the present invention, when x is in a range of 0.1≤x≤0.5 and y is 0 in Empirical Formula 1 of the first nitride layer 510, the thickness of the second nitride layer 520 may be in a range from about 20 nm to 70 nm. Desirably, when x is in a range of 0.1≤x≤0.5 and y is 0 in Empirical Formula 1 of the first nitride layer 510, the thickness of the second nitride layer 520 may be in a range from about 30 nm to 50 nm.

According to an aspect of the present invention, when x is 1 and y is 0 in Empirical Formula 1 of the first nitride layer 510, the thickness of the second nitride layer 520 may be in a range from about 2 nm to 7 nm. Desirably, when x is 1 and y is 0 in Empirical Formula 1 of the first nitride layer 510, the thickness of the second nitride layer 520 may be in a range from about 3 nm to 5 nm. That is, the first nitride layer 510 includes AlN, so that an excellent surface morphology is acquired. Also, the second nitride layer 520 is formed to have a thickness in a range from about 2 nm to 7 nm, so that the 2-DEG layer 400 may be prevented from being formed on the portion corresponding to the gate electrode pattern 610.

When both the first nitride layer 510 and the second nitride layer 520 are AlN, the thickness of the second nitride layer 520 is thinner when compared to both the first nitride layer 510 and the second nitride layer 520 are $Al_xGa1-xN$. When both the first nitride layer 510 and the second nitride layer 520 are AlN, although the thickness of the second nitride layer 520 is relatively thinner, the second nitride layer 520 may prevent the 2-DEG layer 400 from being formed.

The power device may acquire an excellent surface morphology using the first nitride layer 510, and may form the second nitride layer 520 to have a predetermined thickness after forming the first nitride layer 510, so as to prevent the 2-DEG layer 400 from being formed on the portion corresponding to the gate electrode pattern 610.

Accordingly, the power device may be capable of performing a normally-OFF operation since the 2-DEG layer 400 is not formed. Since the 2-DEG layer 400 is not formed on the portion corresponding to the gate electrode pattern 610, a current may not flow between the source electrode pattern 620 and the drain electrode pattern 630, and the power device is in an OFF state, until a bias voltage is applied to the gate electrode pattern 610. Therefore, the power device may control generation of the 2-DEG layer 400 based on a voltage of a gate, and may be capable of performing a normally-OFF operation and thus, may reduce power consumption.

The power device may further include the insulation pattern 710 formed between the second nitride layer 520 and the source electrode pattern 620, and the insulation pattern 720 formed between the second nitride layer 520 and the drain electrode pattern 630. The insulation patterns 710 and 720 may be selected from $SiO_x$, $SiN_x$, and $Al_2O_3$. The insulation patterns 710 and 720 may insulate the gate electrode pattern 610, the source electrode pattern 620, and the drain electrode pattern 630 so as to prevent a short occurring between electrodes.

The source electrode pattern 620 and the drain electrode pattern 630 are formed on the first nitride layer 510, and the gate electrode pattern 610 may be formed on the second nitride layer 520. The gate electrode pattern 610, the source electrode pattern 620, and the drain electrode pattern 630 may be selected from nickel (Ni), Al, Ti, titanium nitride (TiN), platinum (Pt), gold (Au), ruthenium oxide ($RuO_2$), vanadium (V), tungsten (W), tungsten nitride (WN), hafnium (Hf), hafnium nitride (HfN), molybdenum (Mo), nickel silicide (NiSi), cobalt silicide ($CoSi_2$), tungsten silicide (WSi), platinum silicide (PtSi), iridium (Ir), zirconium (Zr), Ta, tantalum nitride (TaN), copper (Cu), ruthenium (Ru), cobalt (Co), and combinations thereof.

The power device may form the second nitride layer 520 on the lower portion of the gate electrode pattern 610 after forming the first nitride layer 510, and a strain may be completely released and thus, piezoelectric effect may be lost in the portion corresponding to the gate electrode pattern 610. Since the 2-DEG layer 400 is not formed on the portion corresponding to the gate electrode pattern 610, the power device may be capable of performing a normally-OFF operation. Therefore, the power device may reduce power consumption by performing the normally-OFF operation.

Hereinafter, a power device manufacturing method according to an embodiment of the present invention will be described.

Figure 2:
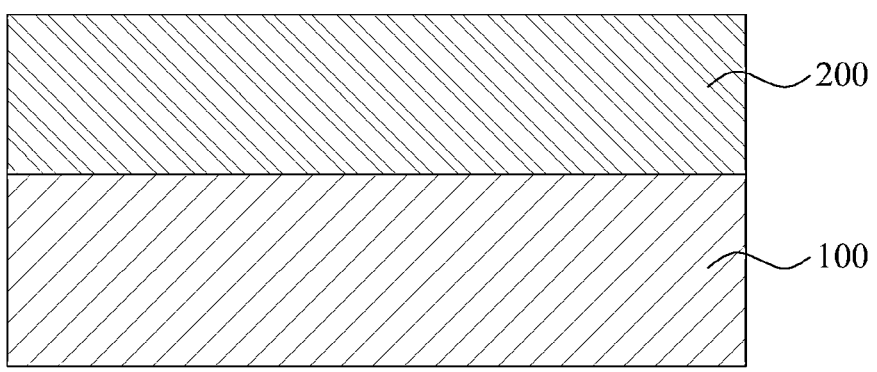
FIGS. 2 through 4 are diagrams illustrating a power device manufacturing method according to an embodiment of the present invention.

FIGS. 2 through 4 illustrate a power device manufacturing method according to an embodiment of the present invention.

Referring to FIGS. 2 through 4, the power device manufacturing method may include forming a semi-insulating GaN layer 200 on the substrate 100, forming an Al-doped GaN layer 300 on the semi-insulating GaN layer 200, forming the first nitride layer 510 on the Al-doped GaN layer 300, forming the second nitride layer 520 on the first nitride layer 510, forming the source electrode pattern 620 and the drain electrode pattern 630 on the first nitride layer 510, and forming the gate electrode pattern 610 on the second nitride layer 520.

As shown in FIG. 2, the semi-insulating GaN layer 200 is formed on the substrate 100. The semi-insulating GaN layer 200 may be formed based on various schemes, for example, a metal-organic chemical vapor deposition (MOCVD) scheme, a molecular beam epitaxy (MBE) scheme, and a hydride vapor phase epitaxy (HVPE) scheme, and the like, and the various schemes may not be limited thereto.

The Al-doped GaN layer 300 may be formed on the semi-insulating GaN layer 200. The Al-doped GaN layer 300 may be formed by doping the GaN layer with Al by less than or equal to 1%, and the Al-doped GaN layer 300 may be formed based on the varied schemes described in the foregoing.

Subsequently, the first nitride layer 500 may be formed on the Al-doped GaN layer 300, the first nitride layer 510 being based on Empirical Formula 1.

$$Al_xIn_yGa_{1-x}N (0.1 \leq x \leq 1 \text{ and } 0 \leq y \leq 0.3) \quad \text{[Empirical Formula 1]}$$

The second nitride layer 520 may be formed on the first nitride layer 510. The second nitride layer 520 may include the same material as the first nitride layer 510. Also, the second nitride layer 520 may include a material corresponding to the material of the first nitride layer 510 doped with a p-type material. For example, the second nitride layer 520 may be $Al_xIn_yGa_{1-x}N$ (0.1≤x≤1 and 0≤y≤0.3) or p-$Al_xIn_yGa_{1-x}N$ (0.1≤x≤1 and 0≤y≤0.3)

Here, p-$Al_xIn_yGa_{1-x}N$ indicates that $Al_xIn_yGa_{1-x}N$ is doped with a p-type material, and the p-type material is a group III element. Since the second nitride layer 520 includes p-$Al_xIn_yGa_{1-x}N$, a charge is (+) and a channel is (−) and thus, charge neutrality is achieved. In a portion corresponding to a lower portion of the gate electrode pattern 610, the 2-DEG layer 400 is not formed and thus, a channel may be removed.

The second nitride layer 520 may be formed based on a regrowth scheme as illustrated in FIGS. 3A through 3D, or may be formed based on an etch scheme as illustrated in FIGS. 4A through 4E.

Hereinafter, a method of forming the second nitride layer 520 will be described in detail.

FIGS. 3A through 3D illustrate a process of forming the second nitride layer 520, in which nitride regrows on a lower portion of the gate electrode pattern 610 after the first nitride layer 510 is formed, so that the second nitride layer 520 is formed.

Referring to FIGS. 3A through 3D, nitride additionally regrows on the lower portion corresponding to the gate electrode pattern 610, after the first nitride layer 510 is formed.

Figure 3A:
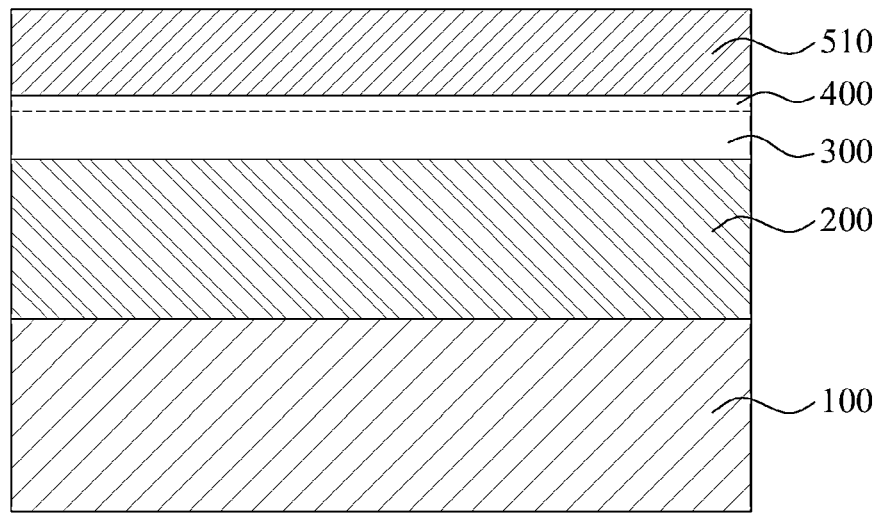
Figure 3B:
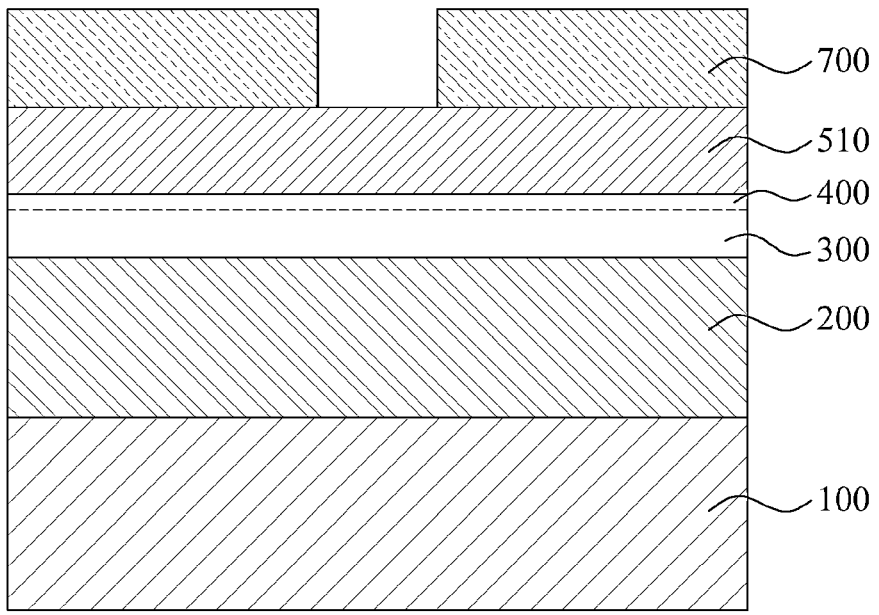
Figure 3C:
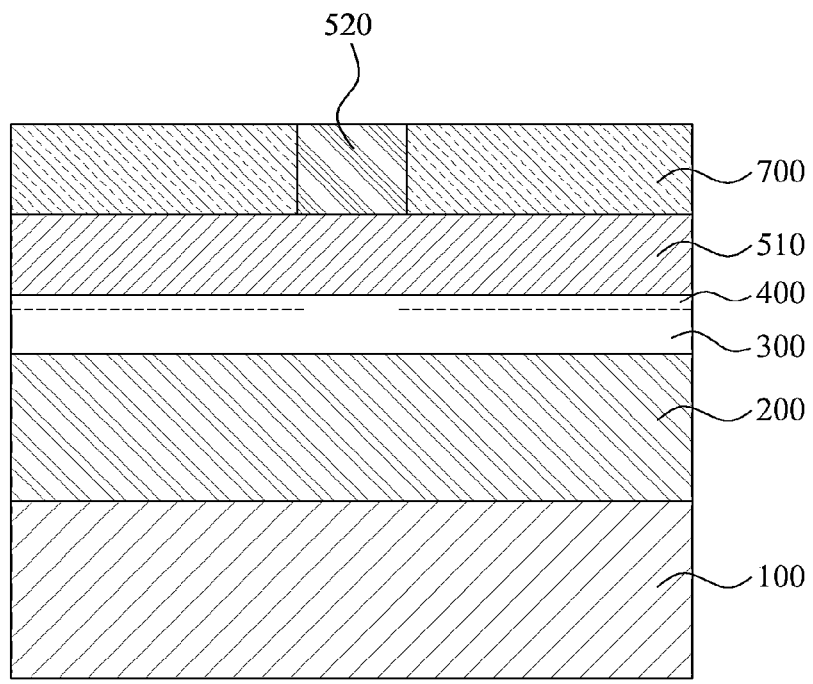
Figure 3D:
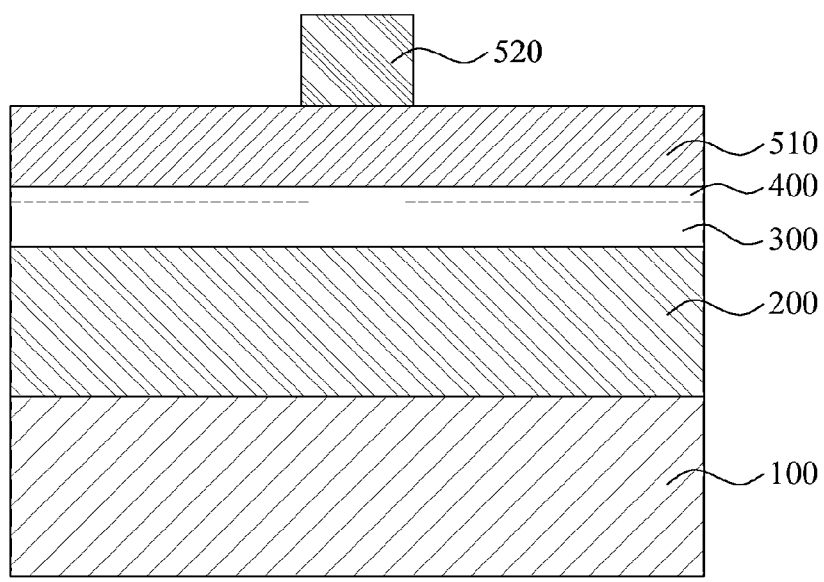

The first nitride 510 is grown to a thickness in a range from about 25 nm to 30 nm as shown in FIG. 3A, and patterning is performed on the first nitride layer 510 based on a photo-resist scheme so as to define a portion corresponding to the gate electrode pattern 610 as shown in FIG. 3B. That is, the first nitride layer 510 may be exposed by etching, based on the photo-resist scheme, the portion corresponding to the gate electrode pattern 610. Subsequently, nitride may be regrown to a thickness in a predetermined range from the exposed first nitride layer 510 as shown in FIG. 3C, and the second nitride layer 520 may be formed by removing a photo-resist 700 as shown in FIG. 3D. The second nitride layer 520 may include the same material as the first nitride 510 or may include a material corresponding to the material of the first nitride layer 510 doped with a p-type material.

FIGS. 4A through 4E illustrate a process of forming the second nitride layer 520, in which a portion excluding a lower portion of the gate electrode pattern 610 is etched after the first nitride layer 510 is formed, so that the second nitride layer 520 is formed.

Referring to FIGS. 4A through 4E, the portion excluding the lower portion corresponding to the gate electrode pattern 610 may be etched to a predetermined thickness, after the first nitride layer 510 is formed.

Figure 4A:
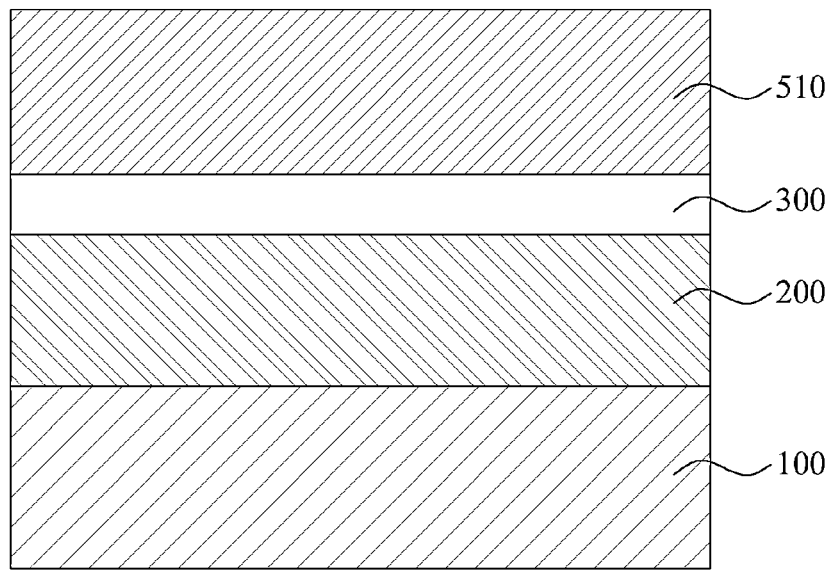
Figure 4B:
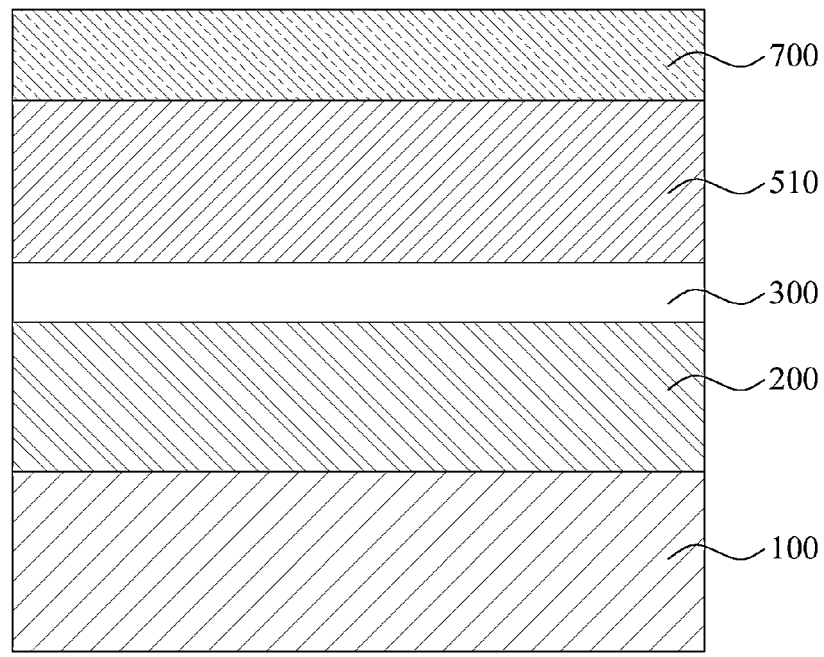
Figure 4C:
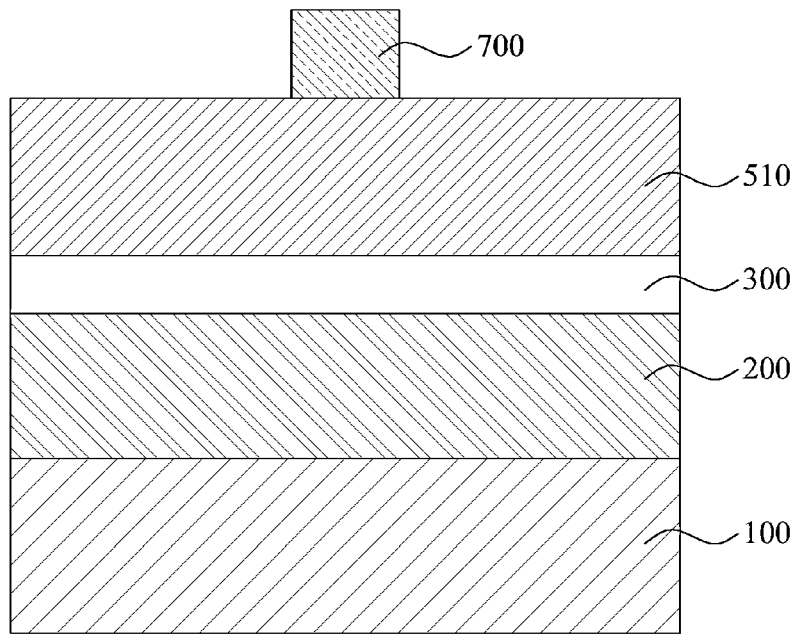

The first nitride 510 may be regrown to a thickness in a range from about 50 nm through 100 nm as shown in FIG. 4A, the photo-resist 700 is formed on a foreside of the first nitride layer 510 as shown in FIG. 4B, and a portion of the photo-resist 700 is patterned and a portion excluding the portion corresponding to the gate electrode pattern 610 is etched as shown in FIG. 4C. That is, the first nitride layer 510 may be exposed excluding the portion corresponding to the gate electrode pattern 610, based on a photo-resist scheme.

Figure 4D:
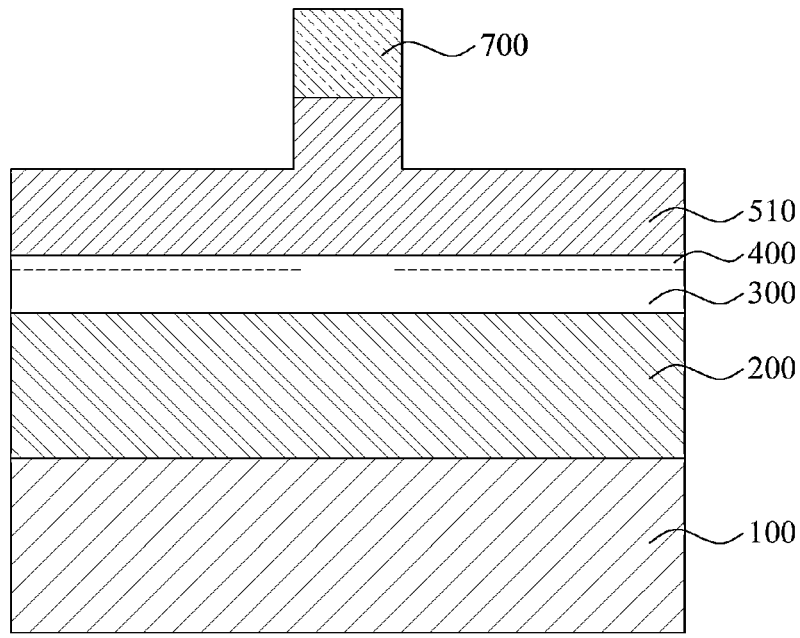
Figure 4E:
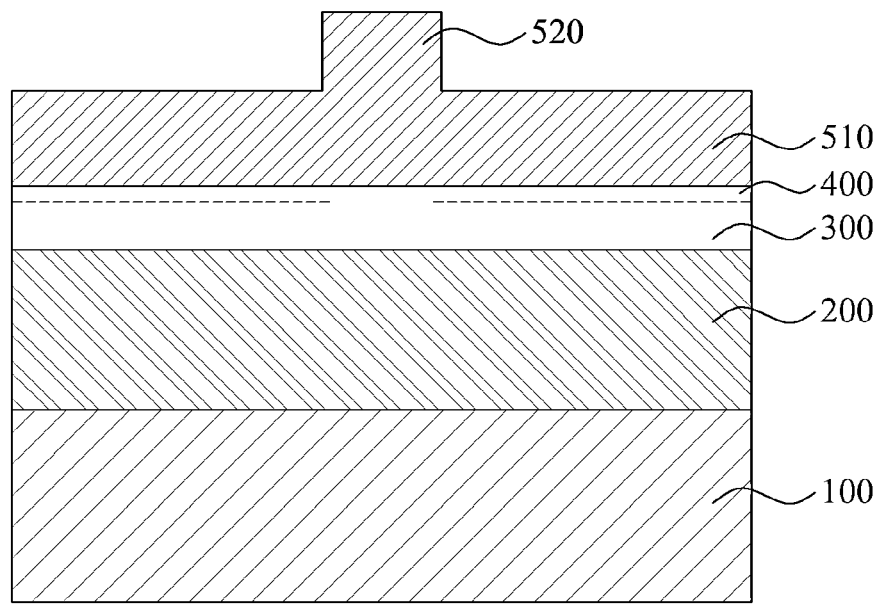

Subsequently, the first nitride layer 510 exposed as shown in FIG. 4D may be etched to a thickness in a range of about 25 nm to 30 nm. The portion corresponding to the gate electrode pattern 610 that is not etched as shown in FIG. 4E may be defined as the second nitride layer 520, and the second nitride layer 520 may be formed. The second nitride layer 520 may include the same material as the first nitride layer 510 or may include a material corresponding to the material of the first nitride layer 510 doped with a p-type material.

Subsequently, the gate electrode pattern 610, the source electrode pattern 620, and the drain electrode pattern 630 are formed on the first nitride layer 510, and the insulation patterns 710 and 720 are formed between electrodes. In this example, the gate electrode pattern 610, the source electrode pattern 620, and the drain electrode pattern 630 may be formed based on a general photolithography scheme.

The second nitride layer 520 formed based on a regrowth process and an etch process as illustrated in FIGS. 3A through 3D and FIGS. 4A through 4E, may be formed to have a predetermined thickness, so as to remove a piezoelectric effect. According to an aspect of the present invention, when x is in a range of $0.1 \leq x \leq 0.5$ and y is 0 in Empirical Formula 1, the thickness of the second nitride layer 520 may be in a range from about 20 nm to 70 nm. Desirably, when x is in a range of $0.1 \leq x \leq 0.5$ and y is 0 in Empirical Formula 1 of the first nitride layer 510, the thickness of the second nitride layer 520 may be in a range from about 30 nm to 50 nm.

According to an aspect of the present invention, when x is 1 and y is 0 in Empirical Formula 1, the thickness of the second nitride 520 may be in a range from about 2 nm to 7 nm. Desirably, when x is 1 and y is 0 in Empirical Formula 1 of the first nitride layer 510, the thickness of the second nitride layer 520 is in a range of about 3 nm to 5 nm. That is, the first nitride layer 510 includes AlN, so that an excellent surface morphology is acquired, and the second nitride layer 520 is formed to have a thickness in a range from about 2 nm to 7 nm, so that the 2-DEG layer 400 may be prevented from being formed on the portion corresponding to the gate electrode pattern 610.

Figure 5:
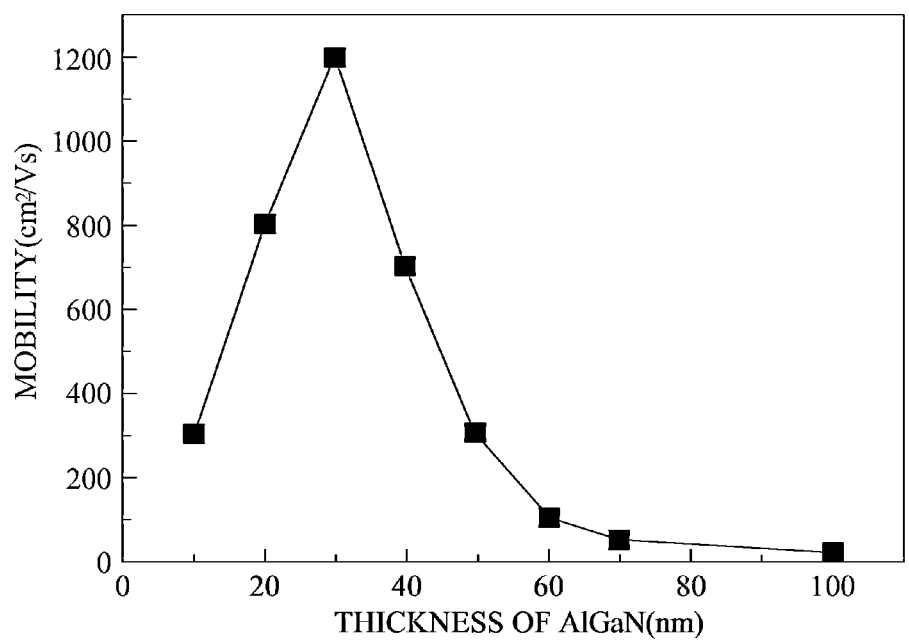
FIG. 5 is a graph illustrating a mobility based on a thickness of an aluminum gallium nitride (AlGaN) layer in a power device according to an embodiment of the present invention.

FIG. 5 illustrates a mobility based on a thickness of an AlGaN layer in a power device according to an embodiment of the present invention. In FIG. 5, the first nitride layer and the second nitride layer are formed to include the same material, and the material may be $Al_{0.3}Ga_{0.7}N$.

As shown in FIG. 5, when x is 0.3 in Empirical Formula 1 of the first nitride and the thickness of the first nitride layer is about 30 nm, a mobility is about 1200 $cm^2/Vs$ and thus, a strongest piezoelectric effect is recognized. Conversely, when x is 0.3 in Empirical Formula 1 of the first nitride layer and a sum of the thickness of the first nitride layer of about 30 nm and a thickness of the second nitride layer of about 40 nm is about 70 nm, a mobility is about 50 $cm^2/Vs$.

Accordingly, when the second nitride layer is formed to have a thickness as described in the foregoing, after the first nitride is formed, a 2-DEG layer may be prevented from being formed on a lower portion of a gate electrode pattern.

Therefore, the power device manufactured based on an aspect of the present invention may not include the 2-DEG layer in a portion corresponding to the lower portion of the gate electrode pattern and thus, a current does not flow between a source electrode pattern and a drain electrode pattern and the power device may be in a OFF state until a bias voltage is applied to the gate electrode pattern. Accordingly, the power device may be capable of performing a normally-OFF operation and thus, may reduce power consumption.

The power device according to an embodiment of the present invention may further include the second nitride layer formed on the lower portion of the gate electrode pattern after the first nitride is formed and thus, may prevent the 2-DEG layer from being formed on the portion corresponding to the gate electrode pattern, and may be capable of performing the normally-OFF operation.

The power device according to an embodiment of the present invention may control generation of the 2-DEG layer based on a voltage of a gate, and may be capable of performing a normally-OFF operation and thus, may reduce power consumption.

To form the second nitride layer corresponding to the gate electrode pattern, the power device may regrow only the portion corresponding to the gate electrode pattern after the first nitride layer is formed, or etch a portion excluding the portion corresponding to the gate electrode pattern, so that a recess process may be omitted, reproducibility of the power device is secured, and a manufacturing process is simplified.

Although a few embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

What is claimed is:
1. A power device, comprising:
a substrate;
a semi-insulating gallium nitride (GaN) layer formed on the substrate;
an aluminum (Al)-doped GaN layer formed on the semi-insulating GaN layer;

a first nitride layer formed on the (Al)-doped GaN layer;
wherein the first nitrade layer comprises a material of Empirical Formula 1:

$$Al_X In_Y Ga_{1-X} N (0.1 \leq x \leq 1 \text{ and } 0 \leq y \leq 0.3);$$ [Empirical Formula 1]

a second nitride layer formed on the first nitride layer; wherein the second nitrade layer comprises the same material as the first layer nitrade layer;
a source electrode pattern and a drain electrode pattern formed on the first nitride layer; and
a gate electrode pattern formed on the second nitride layer.

2. The power device of claim 1, wherein the second nitride layer comprises a material corresponding to the material of the first nitride layer doped with a p-type material.

3. The power device of claim 1, wherein, when x is in a range of about $0.1 \leq x \leq 0.5$, and y is 0 in Empirical Formula 1, a thickness of the second nitride layer is in a range from about 20 nanometers (nm) to 70 nm.

4. The power device of claim 1, wherein, when x is 1 and y is 0 in Empirical Formula 1, a thickness of the second nitride layer is in a range from about 2 nm to 7 nm.

5. The power device of claim 1, further comprising: an insulation pattern formed between the second nitride layer and the source electrode pattern, and an insulation pattern formed between the second nitride layer and the drain electrode pattern.

6. The power device of claim 5, wherein the insulation pattern is selected from a group consisting silicon oxide ($SiO_X$), silicon nitride ($SiN_X$), and aluminum oxide ($Al_2O_3$).

* * * * *